United States Patent
Tomizawa et al.

(10) Patent No.: US 6,865,705 B2
(45) Date of Patent: Mar. 8, 2005

(54) SEMICONDUCTOR INTEGRATED CIRCUIT DEVICE CAPABLE OF SWITCHING MODE FOR TRIMMING INTERNAL CIRCUITRY THROUGH JTAG BOUNDARY SCAN METHOD

(75) Inventors: Masahiko Tomizawa, Tama (JP); Masahiko Nishiyama, Ome (JP)

(73) Assignees: Hitachi, Ltd., Tokyo (JP); Hitachi Ulsi Systems Co., Ltd., Tokyo (JP)

( * ) Notice: Subject to any disclaimer, the term of this patent is extended or adjusted under 35 U.S.C. 154(b) by 0 days.

(21) Appl. No.: 10/359,707

(22) Filed: Feb. 7, 2003

(65) Prior Publication Data

US 2003/0151962 A1 Aug. 14, 2003

(30) Foreign Application Priority Data

Feb. 12, 2002 (JP) .................................... 2002-034652

(51) Int. Cl.$^7$ .................... G01R 31/3185; G11C 29/00
(52) U.S. Cl. ................. 714/727; 714/726; 714/731; 365/201; 365/233; 365/196; 365/202; 365/189.05; 365/220
(58) Field of Search ................ 714/727, 726, 714/729, 731; 365/201, 156, 226, 233, 193, 194, 196, 202, 189.05, 220

(56) References Cited

U.S. PATENT DOCUMENTS

| 5,970,005 A | * 10/1999 | Yin et al. ................... 365/201 |
| 6,163,499 A | * 12/2000 | Suzuki ................... 365/230.06 |
| 6,473,352 B2 | * 10/2002 | Nishino et al. ............. 365/219 |

FOREIGN PATENT DOCUMENTS

| JP | 11-31398 | * 2/1999 | ............ G11C/29/00 |
| JP | 11-289322 | 10/1999 | ............. H04L/7/00 |

* cited by examiner

Primary Examiner—Andrew Q. Tran
(74) Attorney, Agent, or Firm—Reed Smith LLP; Stanley P. Fisher, Esq.; Juan Carlos A. Marquez, Esq.

(57) ABSTRACT

A semiconductor integrated circuit device comprises a control unit for switching a mode about the trimming or estimation in an internal circuit, the control unit including a controller capable of realizing the mode switching control about the trimming or estimation by the JTAG method. The controller includes an instruction decoder for decoding an input instruction, a shift scan register circuit for enabling a boundary scan based on the decoded result of the instruction decoder, and an operation controller for controlling the operations of the instruction decoder and the shift scan register circuit. Therefore, the trimming becomes possible after sealing a semiconductor chip into a package.

6 Claims, 13 Drawing Sheets

FIG. 7

| bit No. | FUNCTION | OUTPUT SIGNAL NAME | INPUT SIGNAL NAME | INITIAL VALUE |
|---|---|---|---|---|
| 1 | VDDI TRIMMING | JRGCEN | — | 0 |
| 2 | | JRGC0 | — | 1 |
| 3 | | JRGC1 | — | 1 |
| 4 | | JRGC2 | — | 1 |
| 5 | | JRGC3 | — | 1 |
| 6 | | JRGC4 | — | 1 |
| 7 | VDDI TRIMMING AT B/I | JBRGCEN | — | 0 |
| 8 | | JBRGC0 | — | 1 |
| 9 | | JBRGC1 | — | 1 |
| 10 | | JBRGC2 | — | 1 |
| 11 | WORD PULSE WIDTH tKHKL LINK MODE | JCKSLBEN | — | 0 |
| 12 | | JCKSLB | — | 0 |
| 13 | WORD PULSE WIDTH ADJUSTMENT | JCKPEN | — | 0 |
| 14 | | JCKP0 | — | 1 |
| 15 | | JCKP1 | — | 1 |
| 16 | | JCKP2 | — | 1 |
| 17 | | JCKP3 | — | 1 |
| 18 | SA ACTIVATION TIMING ADJUSTMENT | JSACEN | — | 0 |
| 19 | | JSAC0 | — | 1 |
| 20 | | JSAC1 | — | 1 |
| 21 | | JSAC2 | — | 1 |
| 22 | | JSAC3 | — | 1 |
| 23 | DQ CK TIMING ADJUSTMENT | JDQTREN | — | 0 |
| 24 | | JDQTR0 | — | 1 |
| 25 | | JDQTR1 | — | 1 |
| 26 | | JDQTR2 | — | 1 |
| 27 | | JDQTR3 | — | 1 |
| 28 | SETUP/HOLD ADJUSTMENT | JSHEN | — | 0 |
| 29 | | JSHA0 | — | 0 |
| 30 | | JSHA1 | — | 0 |
| 31 | | JSHA2 | — | 0 |
| 32 | | JSHC0 | — | 0 |
| 33 | | JSHC1 | — | 0 |
| 34 | | JSHC2 | — | 0 |
| 35 | | JSHD0 | — | 0 |
| 36 | | JSHD1 | — | 0 |
| 37 | | JSHD2 | — | 0 |
| 38 | WORD PULSE WIDTH USUAL MODE | JCKSLDEN | — | 0 |
| 39 | SPARE(3bit) | JQZT0 | — | 0 |
| 40 | | JQZT1 | — | 0 |
| 41 | | JQZT2 | — | 0 |
| 42 | DB EQUALIZE TIMING ADJUSTMENT | JDBEEN | — | 0 |
| 43 | | JDBE0 | — | 1 |
| 44 | | JDBE1 | — | 1 |
| 45 | | JDBE2 | — | 1 |
| 46 | SPARE(13bit) | JDLLCKTH | — | 0 |
| 47 | | JDLLCQ0 | — | 0 |
| 48 | | JDLLCQ1 | — | 0 |
| 49 | | JDLLCNTEN | — | 0 |
| 50 | | JDLLCNT0 | — | 0 |
| 51 | | JDLLCNT1 | — | 0 |
| 52 | | JDLLCNT2 | — | 0 |
| 53 | | JDLLCNT3 | — | 0 |
| 54 | | JDLLCNT4 | — | 0 |
| 55 | | JDLLCNT5 | — | 0 |
| 56 | | JDLLCNT6 | — | 0 |
| 57 | | JDLLCNT7 | — | 0 |
| 58 | | JDLLDIV | — | 1 |

FIG. 8

| bit No. | FUNCTION | OUTPUT SIGNAL NAME | INPUT SIGNAL NAME | INITIAL VALUE |
|---|---|---|---|---|
| 59 | CQ SWITCHING CONTROL | JCQEN | — | 0 |
| 60 |  | JCQSW1 | — | 0 |
| 61 |  | JCQSW2 | — | 0 |
| 62 | SPARE (2bit) | JINBYPEN | — | 0 |
| 63 |  | JINBYP | — | 1 |
| 64 | IMPEDANCE CODE R/W | JZQEN | — | 1 |
| 65 |  | JZTEN | — | 1 |
| 66 |  | JZSEL | — | 0 |
| 67 |  | JZN<0> | JZQN0 | 0 |
| 68 |  | JZN<1> | JZQN1 | 0 |
| 69 |  | JZN<2> | JZQN2 | 0 |
| 70 |  | JZN<3> | JZQN3 | 0 |
| 71 |  | JZN<4> | JZQN4 | 0 |
| 72 |  | JZN<5> | JZQN5 | 0 |
| 73 |  | JZN<6> | JZQN6 | 0 |
| 74 |  | JZP<0> | JZQP0 | 0 |
| 75 |  | JZP<1> | JZQP1 | 0 |
| 76 |  | JZP<2> | JZQP2 | 0 |
| 77 |  | JZP<3> | JZQP3 | 0 |
| 78 |  | JZP<4> | JZQP4 | 0 |
| 79 |  | JZP<5> | JZQP5 | 0 |
| 80 |  | JZP<6> | JZQP6 | 0 |
| 81 | OUTPUT BUFFER SLEW RATE CONTROL | JSR<0> | — | 0 |
| 82 |  | JSR<1> | — | 0 |
| 83 |  | JSR<2> | — | 0 |
| 84 |  | JSR<3> | — | 0 |
| 85 |  | JSR<4> | — | 0 |
| 86 |  | JSR<5> | — | 0 |
| 87 |  | JSR<6> | — | 0 |
| 88 |  | JSR<7> | — | 0 |
| 89 |  | JSR<8> | — | 0 |
| 90 |  | JSR<9> | — | 0 |
| 91 |  | JSR<10> | — | 0 |
| 92 |  | JSR<11> | — | 0 |
| 93 |  | JSR<12> | — | 0 |
| 94 |  | JSR<13> | — | 0 |
| 95 |  | JSR<14> | — | 0 |
| 96 |  | JSR<15> | — | 0 |
| 97 |  | JSR<16> | — | 0 |
| 98 |  | JSR<17> | — | 0 |
| 99 |  | JSR<18> | — | 0 |
| 100 |  | JSR<19> | — | 0 |
| 101 | ×18/×36 SWITCHING | JX18BEN | — | 0 |
| 102 |  | JX18B | — | 1 |
| 103 | RING OSCILLATOR Vth SWITCHING | ROVCHG | — | 0 |
| 104 | DQ REGISTER SLEW SWITCHING | DQRGTH | — | 0 |
| 105 | SPARE(11bit) | UJUSER1<0> | — | 0 |
| 106 |  | UJUSER1<1> | — | 0 |
| 107 |  | UJUSER1<2> | — | 0 |
| 108 |  | UJUSER1<3> | — | 0 |
| 109 |  | UJUSER1<4> | — | 0 |
| 110 |  | UJUSER1<5> | — | 0 |
| 111 |  | UJUSER1<6> | — | 0 |
| 112 |  | UJUSER1<7> | — | 0 |
| 113 |  | UJUSER1<8> | — | 0 |
| 114 |  | UJUSER1<9> | — | 0 |
| 115 |  | UJUSER1<10> | — | 0 |

SEMICONDUCTOR INTEGRATED CIRCUIT DEVICE CAPABLE OF SWITCHING MODE FOR TRIMMING INTERNAL CIRCUITRY THROUGH JTAG BOUNDARY SCAN METHOD

BACKGROUND OF THE INVENTION

The present invention relates to a semiconductor integrated circuit device and more particularly to a mode switching technique about trimming or estimation of an internal circuit included in the above device.

A semiconductor integrated circuit device requires trimming in a delay step for adjusting voltage level of the internal power created by an internal step-down transformer and various timing. The trimming is performed by fixing logic with a fuse circuit and an estimation pad in a step of wafer probing.

AC characteristics such as setup/hold characteristic and clock access are defined as a spec in the input and output terminals of a semiconductor integrated circuit device such as a microcomputer and a memory. An electronic device having a lot of semiconductor integrated circuit devices on a print board requires timing adjustment of signal input and output, owing to unevenness in manufacture of semiconductor elements and delay of a signal according to the pattern writing length or the like. As a technique for flexibly adjusting the timing of a signal by freely changing the AC characteristics, there is known a technique enabling the timing adjustment of signal input and output by providing delaying means for freely delaying a clock signal to be supplied to a latch provided in the I/O terminal, according to a control signal and a boundary scan circuit for setting a delay of this delaying means, for example, as described in Japanese Patent Laid-Open No. 289322/1999.

In the trimming using a fuse, however, it is impossible to trim a semiconductor again after breaking the fuse or sealing the semiconductor chip into a package. When a fuse is broken in one trimming, the fuse cannot be used any more for another trimming. Accordingly, fault analysis becomes difficult in a sample shipped to a customer, in the case of using a fuse. Further, the same sample may be desired to be estimated again in another trimming spec in some cases, but this is impossible and in order to cope with the above case, every fuse is broken so as to prepare various trimming specs for every sample.

Further, according to the technique described in Japanese Patent Laid-Open No. 289322/1999, timing of signal input and output can be adjusted even after sealing a semiconductor chip into a package, by using a boundary scan circuit. However, it is not only the AC characteristics such as setup/hold characteristic and clock access that require the trimming and estimation in a semiconductor integrated circuit device. For example, trimming is required for voltage level of an internal power that is a dynamic operation of an internal circuit and pulse width of a word line selecting signal and a column selecting signal for selecting a memory cell. According to the technique described in Japanese Patent Laid-Open No. 289322/1999, however, another trimming of something other than the AC characteristics is not considered but the trimming of the AC characteristics such as setup/hold characteristic and clock access has been described.

An object of the present invention is to provide a technique enabling estimation in another setting by adjustment, after adjustment using a fuse.

Another object of the invention is to provide a technique enabling adjustment after sealing a semiconductor chip into a package.

The above and the other objects and new features will be apparent from the following description of the invention and the accompanying drawings.

SUMMARY OF THE INVENTION

The outline of a representative example of the invention disclosed in this specification will be as follows.

[1] It is a semiconductor integrated circuit device including an internal circuit and a control circuit for controlling the internal circuit, wherein the control circuit comprises a controller capable of realizing by using a terminal defined by JTAG, at least, one of the following modes: a first mode capable of adjusting an internal voltage level that is an operating voltage of the internal circuit; a second mode capable of adjusting an internal voltage level at a test; a third mode capable of adjusting a pulse width of a word line selecting signal or a column selecting signal for selecting a memory cell included in the internal circuit; a fourth mode capable of adjusting a timing for activating a sense amplifier included in the internal circuit; a fifth mode capable of adjusting a pulse signal for selecting a word line or a column for selecting a memory cell included in the internal circuit, according to a clock signal; a sixth mode capable of adjusting a timing for equalizing a data bus for reading out data in the internal circuit; a seventh mode capable of controlling an impedance of data output in the internal circuit; an eighth mode capable of adjusting rising characteristic or falling characteristic of data supplied from an output circuit included in the internal circuit; a ninth mode capable of switching a simultaneous output bit structure of the data in the internal circuit; and a tenth mode capable of turning a register for data output in the internal circuit into a slew state.

According to the above means, at least one of the above first to tenth modes can be realized by using a terminal defined by the JTAG. Since the circuit operation is possible in the JTAG even after assembling a sample, after adjustment by a fuse, it enables the estimation in another setting changed by the adjustment. Further, it enables the adjustment after sealing a semiconductor chip into a package.

At this time, in order to make the data update easy, with an estimation debug function shift register capable of scanning out the information for estimation debug, it is preferable to provide with an estimation debug function update register capable of updating the trimming or estimation mode by updating the memory contents according to the information scanned in the estimation debug function shift register and a controller for controlling the operations of the estimation debug function shift register and the estimation debug function update register.

Further, the semiconductor integrated circuit device is provided with a fuse circuit capable of logic setting; an estimation pad; a first selecting unit capable of selecting an output signal of the fuse circuit or a signal depending on a state of the estimation pad; a second selecting unit capable of selecting the selected output logic of the first selecting unit or an output signal of the estimation debug register; and a circuit for performing adjustment according to the selected output signal of the second selecting unit, thereby using the fuse circuit, the estimation pad, and the estimation debug function register selectively.

[2] A semiconductor integrated circuit device from another viewpoint of the invention comprises an internal circuit and a control circuit for controlling the internal circuit, the control circuit including a controller capable of realizing a switching control of a mode for adjusting the internal circuit by using a terminal defined by JTAG. The controller includes an instruction decoder for decoding an input instruction, a shift scan register circuit for enabling a boundary scan operation based on the decoded result in the instruction decoder, and an operation controller for controlling the operations of the instruction decoder and the shift scan register circuit, and the shift scan register circuit includes a register capable of information settings for switching a mode for adjusting the internal circuit. The semiconductor integrated circuit device, in a preferred mode, comprises: an estimation debug function shift register capable of scanning out information for estimation debug; an estimation debug function update register capable of setting the mode by setting memory contents according to the information scanned in the estimation debug function shift register; and a controller for controlling the operations of the estimation debug function shift register and the estimation debug function update register.

The semiconductor integrated circuit device, in further another preferred mode, comprises: a fuse circuit capable of information setting; an estimation pad; a first selecting unit capable of selecting an output signal of the fuse circuit or a signal depending on a state of the estimation pad; a second selecting unit capable of selecting the selected output logic of the first selecting unit or an output signal of the estimation debug function register; and a circuit for performing adjustment according to the selected output signal of the second selecting unit.

BRIEF DESCRIPTION OF THE DRAWINGS

FIG. 7 is a view for use in describing trimming/estimation mode switching items in the JTAG portion.

FIG. 8 is a view for use in describing the trimming/estimation mode switching items in the JTAG portion.

DESCRIPTION OF THE PREFERRED EMBODIMENTS

Figure 1:
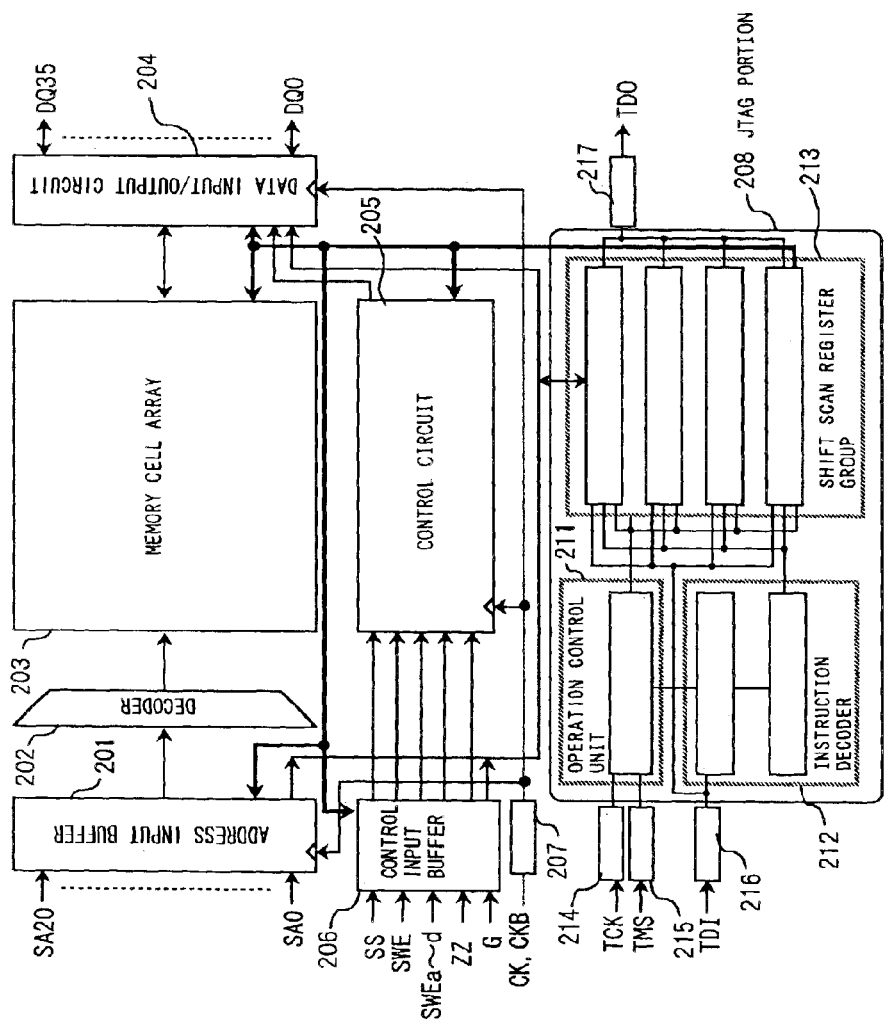
FIG. 1 is a block diagram showing a constitutional example of an SRAM that is an example of a semiconductor integrated circuit device, according to the invention.

FIG. 1 shows an SRAM (Static Random Access Memory) that is one example of a semiconductor integrated circuit device according to the invention.

The SRAM shown in FIG. 1 is formed on one semiconductor board such as a monocrystal silicon board, not specified, according to a well-known manufacturing technique of a semiconductor integrated circuit device.

The SRAM is provided with a memory cell array 203, which is formed by a plurality of word lines and a plurality of data lines intersecting with each other and a plurality of static memory cells at the above intersections in array. It is provided with an address input buffer 201 for receiving address signals SA0 to SA20. A decoder 202 for decoding the received address signals is provided in a posterior stage of the address input buffer 201. The word lines in the memory cell array 203 are driven at each select level based on the decoded result of the low addresses. When one word line is driven at a select level, all the memory cells connected to the word line are selected and the data writing and reading to and from the memory cells is permitted through the corresponding data lines. The memory cell array 203 is combined with a data line selecting circuit for selectively combining pairs of the data lines with pairs of common lines in the corresponding memory cell array. The data line selecting operation in the data line selecting circuit is performed based on the decoded result of a column address signal. In the vicinity of the data line selecting circuit, it is provided with a data input/output circuit 204 including a sense amplifier for amplifying the signal level of the corresponding common line and an input buffer for receiving the writing data. It is provided with a control input buffer 206 for receiving various control signals input from the outside. Various control signals supplied from the outside are not particularly restricted but include a chip select signal SS for selecting a chip, a write-enable signal SWE for instructing the writing operation, a byte write-enable signal SWEa–d for selecting the byte area indicated by a to d, a sleep mode select signal ZZ for shifting to a standby mode, and an output disable signal G for turning into a high impedance state. It is provided with a control circuit 205 for controlling the operations of the respective units according to the various control signals input through the control input buffer 206. Further, it is provided with a clock buffer 207 for receiving clock signals CK and CKB transmitted from the outside. The clock signals received through the clock buffer 207 are transmitted to the address input buffer 201, the control circuit 205, and the data input/output circuit 204, so as to move the respective units in synchronization with the clock signals.

This embodiment is provided with a JTAG portion 208 as a controlling unit for controlling the mode switching operation about the trimming or estimation in the internal circuit according to the JTAG (Joint Test Action Group). Here, "JTAG" is standardized as "IEEE1149.1" in 1990. The JTAG portion 208 includes a decoder for decoding an input instruction, a shift scan register group (a shift scan register circuit) 213 enabling boundary scan based on the decoded result by the instruction decoder, and a decoder 212 for decoding the input instruction. The JTAG compatible device is provided with each signal pin (terminal) for TDI (Test Data In), TDO (Test Data Out), TCK (Test Clock), and TMS (Test Mode Select). In this embodiment, the respective signal pins for TCK, TMS, and TDI are connected with the JTAG portion 208 through the respective input circuits 214, 215 and 216. This can receive the test clock signal, the test mode select signal, and the test data. The signal pin for TDO is connected with the JTAG portion 208 through an output circuit 217, hence to permit the output of the test data from the JTAG portion 208.

Figure 3:
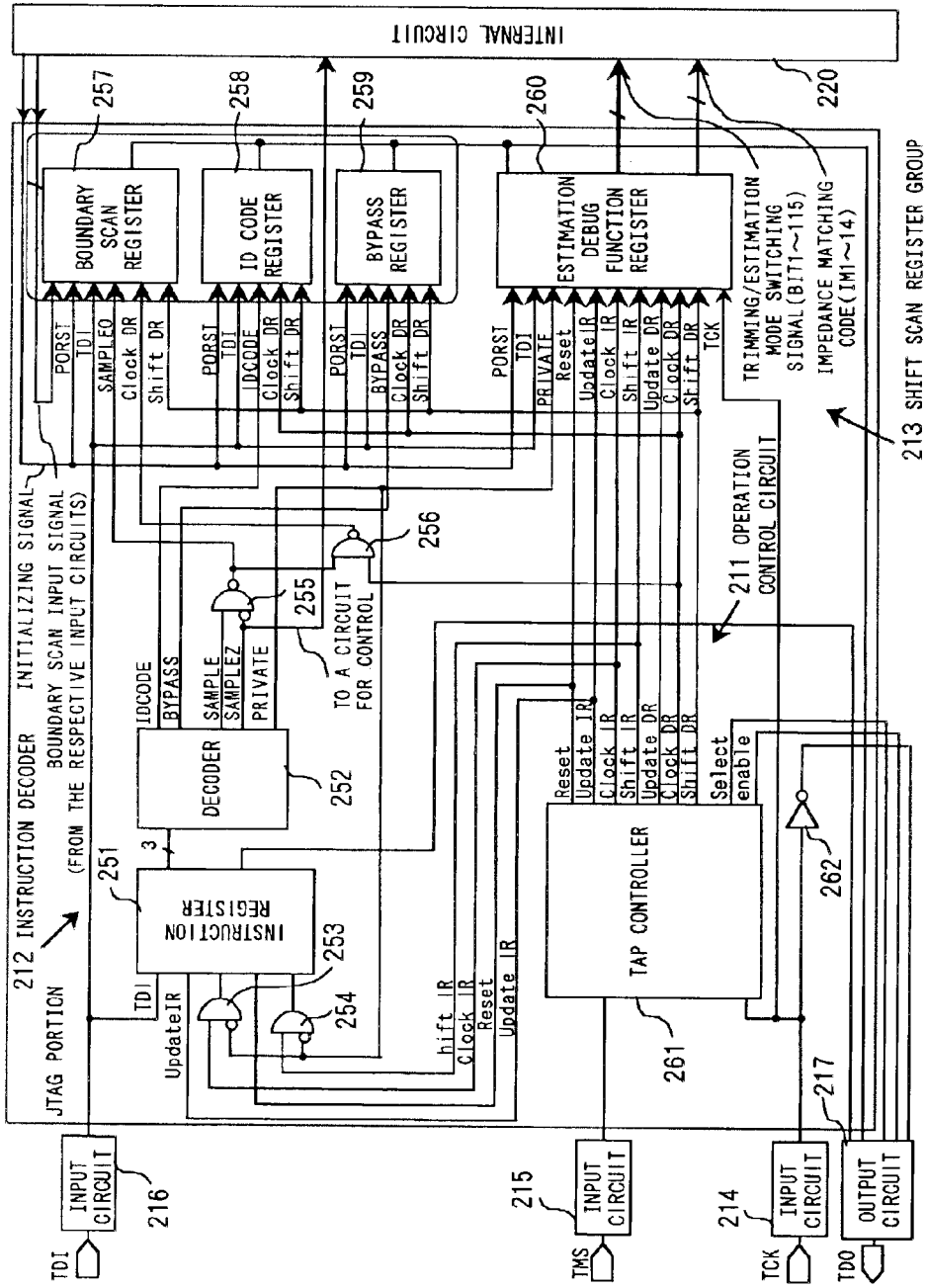
FIG. 3 is a block diagram showing a constitutional example of a JTAG portion in the SRAM.

FIG. 3 shows a constitutional example of the JTAG portion 208.

The JTAG portion 208 includes the operation control unit 211, the instruction decoder 212, and the shift scan register group 213.

The shift scan register group 213 includes a data register 263 enabling the shift scan of the data and a register 260 for estimation debug function provided for estimation debug. The data register 263 includes a boundary scan register 257, an ID code register 258, and a bypass register 259.

Figure 5:
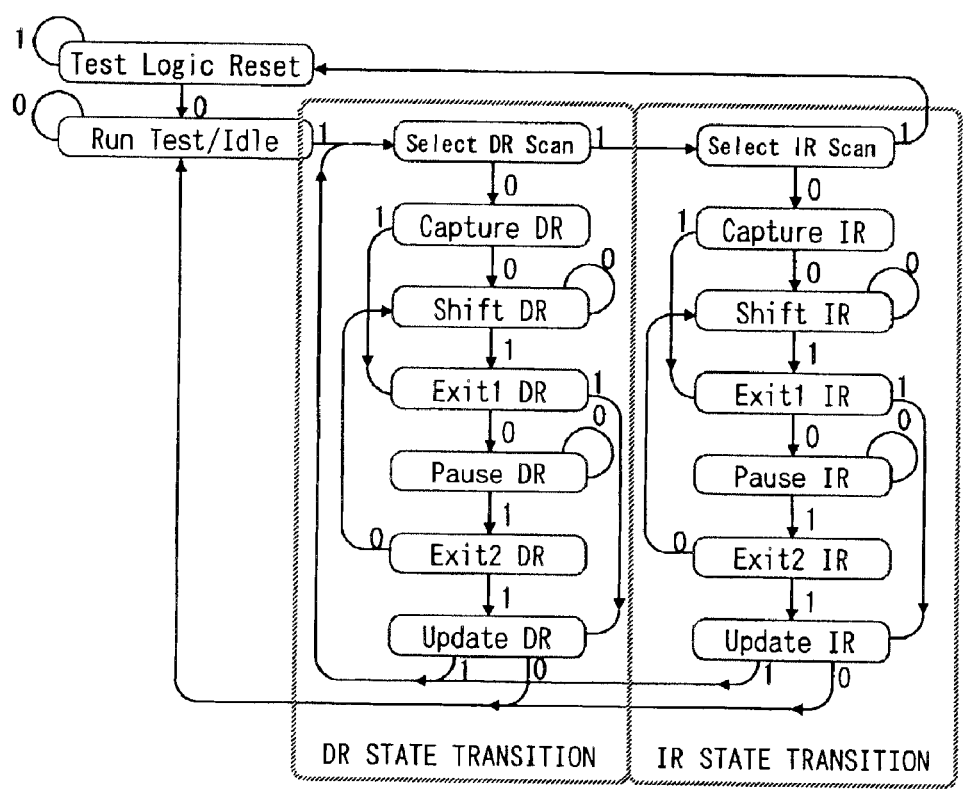
FIG. 5 is a view for use in describing the status transition in a TAP controller.

The operation control unit 211 includes a TAP (Test Access Port) controller 261, and gate circuits 262, 253, 254, 255, and 256. The signals from the respective signal pins for TCK and TMS are transmitted to the TAP controller 261 through the respective corresponding input circuits 214 and 215. Depending on the input of TCK and TMS, a status is shifted as shown in FIG. 5 and various control signals to be supplied to the data register 263, the estimation debug function register 260 and the instruction decoder 212 are created. Here, the various upper control signals include a reset signal Reset for resetting each unit, a signal UpdateIR for setting the data scanned in the TDI signal pin, in a register for transmitting the data to the next circuit, and simultaneously coming out of the IR status transition (refer to FIG. 5), a clock signal Clock IR for an instruction register 251 and an estimation debug function data register, a signal Sift IR for turning various registers into the shift scan mode, a signal UpdateDR for setting the data scanned in the TDI, in a register for transferring the data to the next circuit, and simultaneously coming out of the DR transition state (refer to FIG. 5), a clock signal Clock DR for the shift scan register group 213, a signal Shift DR for turning the shift scan register group 213 into the shift scan mode, and a selecting signal Select and an enable signal enable of the output circuit 217.

The instruction decoder 212 includes the instruction register 251 and a decoder 252 positioned in its rear stage. An instruction supplied from the TDI is kept in the instruction register 251 and then decoded by the decoder 252. When the Update IR and the select signal PRIVATE of estimation debug function are asserted for controlling the operation of the instruction register 251, the CLock IR and ShiftIR are transmitted there through the gates 253 and 254. The instruction register 251 keeps the test instruction of three bit-structure and sets the test instruction in the IR state transition shown in FIG. 5. The instruction supplied from the instruction register 251 is regarded as the three bit-structure. The instruction of three bit-structure is decoded by the posterior decoder 252, hence to create each signal of IDCODE, BYPASS, SAMPLE, SAMPLEZ, and PRIVATE. The information of three bit-structure is decoded by the decoder 252, hence to obtain the following control signals.

The instruction code logic "000" indicates SAMPLE-Z. The instruction takes the information from the outward pin into the boundary scan register 257 and shift scans the information to read the above from the TDO pin.

The instruction code logic "001" indicates ID-CODE. According to this instruction, the ID code register 258 keeps the information about the vendor code and product from its initial state and reads out the same information.

The instruction code logic "010" indicates the same SAMPL-Z as in the case of the above logic "000".

The instruction code logic "011" indicates BYBPASS. According to this instruction, the bypass register 259 bypasses the test circuit by the register (1 bit) between the TDI pin and the TDO pin.

The instruction code logic "100" indicates SAMPLE. Although the function of this instruction is the same as that of the SAMPLE-Z instruction, it is different from that of the SAMPLE-Z instruction in that, only as for the DQ pin, the information of the internal circuit (output data of SRAM), not the information from the outward pin, is taken in the boundary scan register 257.

The instruction code logic "101" indicates BYBPASS and it is the same as in the case of the instruction code logic "011".

The instruction code logic "110" indicates PRIVATE. According to this instruction, the estimation debug function register 260 keeps the information for switching the mode for adjusting the internal circuit, for example, the information for switching the trimming/estimation mode of the internal circuit. There exists a function of receiving an internal signal, depending on the estimation items, and the estimation debug function shift register 404 can scan the TDO pin for reading out the information.

The instruction code logic "111" indicates BYBPASS and it is the same as in the case of the instruction code logic "011".

The IDCODE is regarded as a select signal of the ID code register 258, and transmitted to the ID code register 258. The BYPASS is regarded as a select register of the bypass register 259 and transmitted to the bypass register 259. The SAMPLE and SAMPLEZ are regarded as the select signals of the boundary scan register 257 and transmitted to the gate circuit 255. The boundary scan register 257 receives the information (the information received from the outward pin or supplied from the SRAM) and shift-scans the registers connected in serial, hence to read out the information sequentially from the TDO pin in the prior device, to the internal circuit. The output signal of the gate circuit 255 is transmitted to the boundary scan register 257 as the SAMPLE0. When the SAMPLEZ is asserted, the output buffer of the data input/output circuit 204 turns into a high impedance state, which permits the intake of the outward data from the DQ pin. When the output signal of the gate circuit 255 is at a high level, the Clock DR from the TAP controller 261 is transmitted to the boundary scan 257 through the gate circuit 256. The internal circuit 220 includes the control circuit 205, the control input buffer 206, the address input buffer 201, and the data input/output circuit 204. The data register 263 and the estimation debug function register 260 receive an initializing signal PORST from the internal circuit 220, to be initialized by this initializing signal PORST. A mode switching signal for trimming/estimation (Bit1 to 115) of 115 bit-structure, not particularly restricted, is transmitted to the output of the estimation debug function register 260 and impedance matching codes (IMl to 14), not particularly restricted, are transmitted to the input of the estimation debug function register 260.

Figure 4:
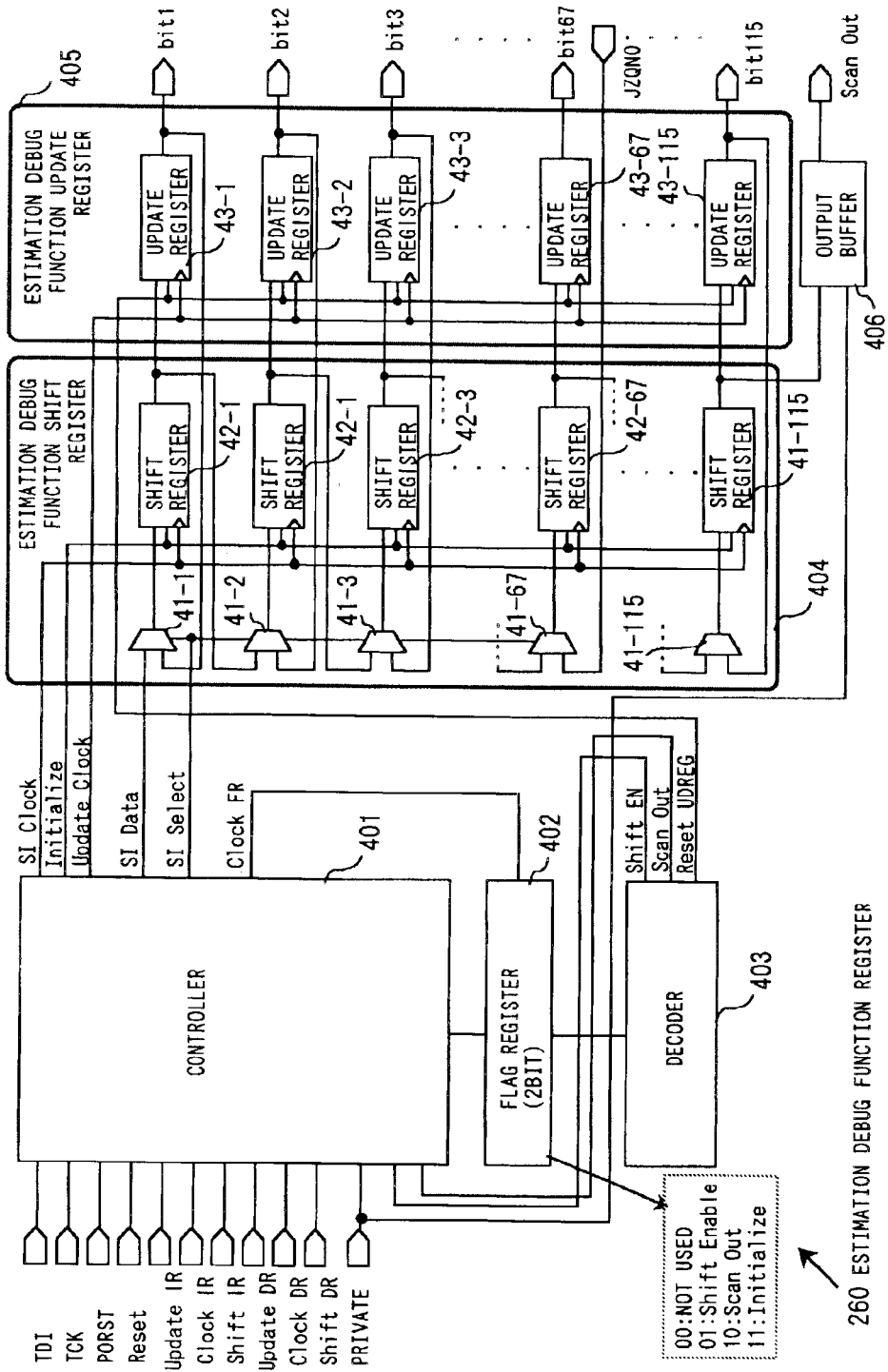
FIG. 4 is a register for estimation debug function in the JTAG portion.

FIG. 4 shows the structure of the estimation debug function register 260.

The estimation debug function register 260 includes a controller 401, a flag register 402, a decoder 403, a shift register 404 for estimation debug function, an update register 405 for estimation debug function, and an output buffer 406. The controller 401 supplies a scan clock SI Clock, an initializing signal Initialize of the shift register, an update clock signal Update Clock, a scan-in data SI Data, and a scan-in select signal SI Select to the estimation debug function shift register 404 and the estimation debug function update register 405, hence to control the shift operation of the estimation debug function shift register 404 and the update of the held data of the estimation debug function update register 405. The estimation debug function shift register 404 includes 115 shift registers 42-1 to 42-115 connected with each other in a manner capable of shifting data according to the scan clock signal SI Clock and selectors 41-1 to 41-115 for switching the transmission path of each input signal to the respective shift registers 42-1 to 42-115. The estimation debug function update register 405 includes 115 update registers 43-1 to 43-115, corresponding to the respective shift registers 42-1 to 42-115, capable of holding the respective output data from the respective shift registers. The held data of the shift registers 42-1 to 42-115 at that time is all transferred to the update registers 43-1 to 43-115 respectively, in synchronization with the update clock signal sent from the controller 401. The held data of the update registers 43-1 to 43-115 is transmitted to the internal circuit 220 as a trimming/estimation mode switching signal (bit1 to 115) (refer to FIG. 3). The decoder 403 decodes the flag transmitted from the controller 401 through the flag register 402, hence to create a shift enable signal Shift EN, a scan-out instruction signal Scan Out, and a reset signal Reset UDREG. The shift enable signal Shift EN and the scan-out instruction signal Scan Out are transmitted to the controller 401. The estimation debug function update register 405 is reset according to the reset signal Reset UDREG supplied from the decoder 403. The output buffer 406 receives the output signal of the shift register 42-115 for scanning out the estimation debug function information, while the select signal PRIVATE of the estimation debug function is asserted, and supplies it.

The items of trimming/estimation mode switching performed by the JTAG portion 208 will be described with reference to FIG. 7 and FIG. 8. The bit number (bit No.) in FIG. 7 and FIG. 8 shows the connection order of the shift scan registers and this example has the total sum of 115 bits of the shift scan registers.

At first, the trimming will be described as below.

<VDDI Trimming>

The internal power VDDI obtained by the step-down circuit stepping down the high potential power VDD supplied from the outside is adjusted in 32-stepped voltage according to the five bits of the bit number 2 through the bit number 6 (represented as "bit#"). This function can be controlled also by the fuse and estimation pad, as well as by the JTAG portion 208. In the case of the trimming by the JTAG portion 208, the logic "1" is set at the register of bit #1.

<VDDI Trimming at Burn-In>

The voltage level of the internal power VDDI created in the step-down circuit at a burn-in time is adjusted in 8 steps according to the three bits of the bit #8 through #10. This function can be controlled also by the fuse and estimation pad, as well as by the JTAG portion 208. In the case of trimming by the JTAG portion 208, the logic "1" is set at the register of bit #7.

<Word Pulse Width Adjustment>

The pulse width of the word line select signal and the column select signal for selecting a memory cell included in the memory cell array 203 shown in FIG. 1 is adjusted in 16 steps according to the four bits of the bit #14 through #17. This function can be controlled also by the fuse and estimation pad, as well as by the JTAG portion 208. In the case of the trimming (adjustment) by the JTAG portion 208, the logic "1" is set at the register of bit #13.

<Sense Amplifier Activation Timing Adjustment>

The timing for activating the sense amplifier included in the data input/output circuit 204 shown in FIG. 1 is adjusted in 16 steps according to the four bits of the bit #19 through #22. This function can be controlled also by the fuse and estimation pad, as well as by the JTAG portion 208. In the case of the trimming by the JTAG portion 208, the logic "1" is set at the register of bit #18.

<DQ CK Timing Adjustment>

The timing of the clock signal for supplying data from the output buffer included in the data input/output circuit 204 shown in FIG. 1 is adjusted in 16 steps according to the four bits of the bit #24 through #27. This function can be controlled also by the fuse, as well as by the JTAG portion 208. In the case of the adjustment by the JTAG portion 208, the logic "1" is set at the register of bit #23.

<Set Amplifier/Hold Adjustment>

Each delay of the address signal, the control signal and the data signal within this SRAM is adjusted. Each delay of the address signal, the control signal, and the data signal is individually adjusted in 8 steps, according to the respective three bits of the bit #29 to "31, the bit #32 to #34, and the bit #35 to 37. This function can be controlled also by the fuse, as well as by the JTAG portion 208. In the case of the adjustment by the JTAG portion 208, the logic "1" is set at the register of bit #28.

<DB Equalize Timing Adjustment>

The timing for equalizing the data bus (DB) in a reading cycle is adjusted in 8 steps according to the three bits of the bit #43 through #45. This function can be controlled also by the fuse, as well as by the JTAG portion 208. In the case of the adjustment by the JTAG portion 208, the logic "1" is set at the register of bit #42.

This time, the estimation mode switching will be described below.

<Word Pulse Width tKHKL Link Mode>

It is a mode for expanding the link to tKHKL (the time between the rise edge and the fall edge of a clock signal) with the pulse width of the word line and column select signal for selecting a memory cell in the memory cell array 203 shown in FIG. 1. Usually, a pulse is generated by the pulse width generating circuit. This function can be controlled also by the estimation pad, as well as by the JTAG portion 208. In the case of the adjustment by the JTAG portion 208, the logic "1" is set at the registers of bit #11 and #12. Further, even in the case of the burn-in mode with the logic "1" set for both the mode signals (M1, M2) supplied from the outside, although it comes in the word pulse width tKHKL link mode, the setting of the logic "1" at the register of bit #38 enables the word pulse width to be the usual pulse width also in the case of burn-in by the M1 and M2 signals.

<Impedance Matching Code R/W>

It is provided with a function of writing a code for controlling the output impedance of the output buffer in the data input/output circuit 204 shown in FIG. 1 from the outside and a function of reading out the code corresponding to the impedance the output buffer sets at present. The fourteen bits of the bit #67 through #80 are regarded as the registers for storing the codes at the writing and the reading of the impedance code. A writing or reading control signal is set at the bit #64 to the bit #66. The impedance codes to be read out are indicated by IM1 to 14 in FIG. 3 and transmitted through the impedance codes combined with the output buffer of the data input/output buffer 204 within the internal circuit 220.

<Output Buffer Slew Rate Control>

A code for adjusting the rising and falling characteristic (tr/tf) of the data supplied from the output buffer in the data input/output circuit 204 shown in FIG. 1 is set for twenty bits of bit #81 through #100.

<x8/x36 Switching>

The I/O (input/output) structure in the data input/output circuit 204 can be switched from x36 to x18. This function can be controlled also by the estimation pad, as well as by the JTAG portion 208. In the case of the adjustment by the JTAG portion 208, the logic "1" and the logic "0" are respectively set at the registers of bit #101 and #102.

<Ring Oscillator Measurement>

Ring oscillator measurement has to use the setting according to both the estimation pad and the JTAG. In the control by the JTAG, two kinds of ring oscillators having the different MOS transistors are switched with each other and a control for supplying the oscillatory waveform is performed. The former switching is possible only in the case of the JTAG. For example, when the logic "0" is set at the bit #103, it enables the estimation by the ring oscillator including the MOS transistor having the lower threshold, and when the logic "1" is set at the bit #103, it enables the estimation by the ring oscillator having the MOS transistor having the higher threshold. The latter control of supplying the oscillatory waveform can be realized by setting the logic "1" at the bit #59 and setting the logic "0" and "1" at the bit #60 and #61 respectively.

<Slew Switching of DQ Register>

Although the SRAM shown in FIG. 1 supplies data in synchronization with a clock signal, in this slew switching mode of the DQ register, the RAM access time can be estimated by controlling a clock signal so as to make slew the register for controlling the data output. In this mode, switching is possible only by the JTAG, and this mode is selected by setting the logic "1" at the bit #104.

Figure 6:
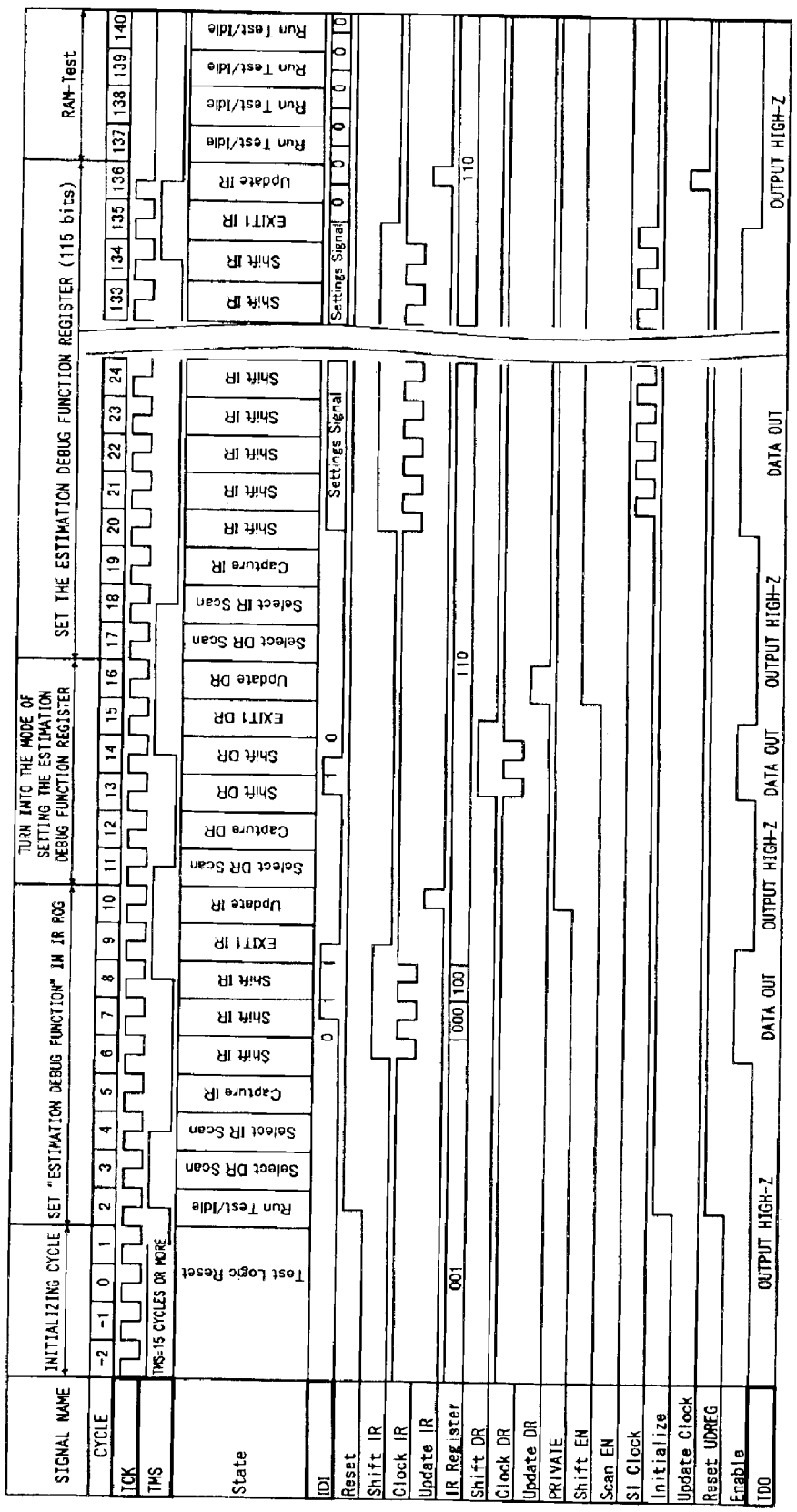
FIG. 6 is a view for use in describing an operation of the JTAG portion.

FIG. 6 shows the operation timing of a main portion in the case of setting the trimming/estimation mode switching at the estimation debug function register in the JTAG portion 208. The respective states in FIG. 6 correspond to the respective states in FIG. 5.

<JTAG Initialization>

The TMS pin is turned into the logic "1". The transition state is in the Test Logic Reset. By operating the TMS pin in 5 cycles or more with the logic "1", it comes into the Test Logic Reset state shown in FIG. 5. Here, one cycle means one pulse cycle of the TCK pin. During the above period, the reset signal Reset turns to the logic "0" and the instruction register 251 and the estimation debug function register 260 are reset (corresponding to the timing cycle 1).

<Selection of PRIVATE Instruction (Estimation Debug Function Register)>

The TMS pin is turned into the logic "0", thereby turning the state into RunTest/Idle. At this time, the reset signal Reset from the TAP controller 261 becomes the logic "1" and the reset is released (corresponding to the cycle 2).

Next, the TMS pin is turned into the logic "1", thereby turning the state into Select DR Scan (corresponding to the cycle 3).

The TMS pin is turned into the logic "1", thereby turning the state into Select IR Scan and selecting the IR state transition (corresponding to the cycle 4).

The TMS pin is turned into the logic "0", thereby turning the state into Capture IR (corresponding to the cycle 5). Continuously, the TMS pin is turned into the logic "0", thereby turning the state into Shift IR. When the Shift IR becomes the logic "1" and while the TMS pin is in the logic "0", the clock signal Clock IR is created. According to the Clock IR, the input data from the TDI pin is scanned in the shift register of the instruction register 251 in serial (corresponding to the cycles 6 to 8).

The TMS pin is turned into the logic "1", thereby turning the state into EXIT1 IR. At this time, the signal Shift IR becomes the logic "0", the Clock IR is stopped, and the shift register of the instruction register is stopped, holding the three bits of the instruction code (corresponding to the cycle 9). Then, the information of the three bits for selecting the PRIVATE instruction of "110" is set at the shift register.

The TMS pin is turned into the logic "1", thereby turning the state into UPDATE IR. At this time, the pulse of the logic "1" is supplied to the signal Update IR and the scanned-in three bit-code "110" is taken in the update register of the instruction register. The above-mentioned information of the update register is decoded by the decoder 252, the signal PRIVATE shown in FIG. 3 becomes the logic "1" 1, and the estimation function register 260 is selected (corresponding to the cycle 10).

<Setting of the Estimation Debug Function Register>

The TMS pin is turned into the logic "1", thereby turning the state into Select DR IR and selecting the DR state transition (corresponding to the cycle 11).

The TMS pin is turned into the logic "0", thereby turning the state into Capture DR (corresponding to the cycle 12).

The TMS pin is turned into the logic "0", thereby turning the state into Shift DR. At this time, the signal Shift DR becomes the logic "1" and while the TMS pin is in the logic "0", a clock signal Clock DR is created. A Clock FR of the flag register 402 is created in the gate circuit of the AND of the Clock DR and the PRIVATE. During the two cycles of the Shift DR, the input data from the TDI pin is scanned in the flag register 402 in serial according to the Clock FR (corresponding to the cycles 13 to 14).

The TMS pin is turned into the logic "1", thereby turning the state into EXIT1 DR. At this time, the signal Shift DR becomes the logic "0", the Clock DR is stopped, and the shift register of the flag register is stopped, holding the two bits of the flag code (corresponding to the cycle 15). The information of the logic "01" is set at the shift register.

The TMS pin is turned into the logic "1", thereby turning the state into UPDATE DR. At this time, the pulse of the logic "1" is supplied to the signal UPDATE DR, and the scanned-in flag "01" of two bits is taken in the update register of the flag register. The above information of the update register is decoded by the decoder 403, the signal Shift EN shown in FIG. 4 becomes the logic "1", and the shift register in the estimation debug function register 260 comes into a state capable of shift scanning the input from the pin TDI.

<Setting of Information at the Estimation Debug Register>

The TMS pin is turned into the logic "1", thereby turning the state into Select DR Scan (corresponding to the cycle 17).

The TMS pin is turned into the logic "1", thereby turning the state into Select IR Scan and selecting the IR state transition (corresponding to the cycle 18).

The TMS pin is turned in the logic "0", thereby turning the state into Capture IR (corresponding to the cycle 19).

Continuously, the TMS pin is turned into the logic "0", thereby turning the state into Shift IR. The signal Shift IR becomes the logic "1", and while the TMS pin is in the logic "0", the clock signal Clock IR is created. A clock signal created by the AND of the Clock IR and the PRIVATE is SI Clock and according to this SI Clock, the input from the TDI pin is scanned in the estimation debug function shift register in serial. The Shift IR state continues for 115 bits (corresponding to the cycles 20 to 134).

The TMS pin is turned into the logic "1", thereby turning the state into EXIT1 IR. At this time, the signal Shift IR becomes the logic "0", the Clock IR is stopped, and the shift registers in the estimation debug function register 260 are stopped, holding the information for 115 bits supplied to the internal circuit 220 (corresponding the cycle 135).

The TMS pin is turned into the logic "1", thereby turning the state into UPDATE IR. At this time, the pulse of the logic "1" is supplied to the signal Update IR, the Update IR and the PRIVATE are ANDed, according to it, the pulse of the logic "1" is supplied to the update clock signal Update Clock of the update register 405 in the estimation debug function register 260, and the held content is updated (corresponding to the cycle 136).

<Ram Test>

The TMS pin is turned into the logic "0", thereby turning the state into Run Test/Idle. According to the update information of the update register 405 in the estimation debug function register 260, the SRAM test is performed in the trimming or estimation mode (corresponding to the cycles 137 to 140).

The above is the operation for setting arbitrary information in the estimation debug function register. Initializing the information of the estimation debug function register forcedly is enabled by setting the logic "11" in the status transition of the <setting of the estimation debug function register>.

The initializing signal Reset UDREG of the estimation debug function update register becomes the logic "0" and the above-mentioned register is initialized. The estimation debug function register is provided with a function for reading out (scanning out) the information provided to the internal circuit, held by the estimation debug function update register.

Figure 9:
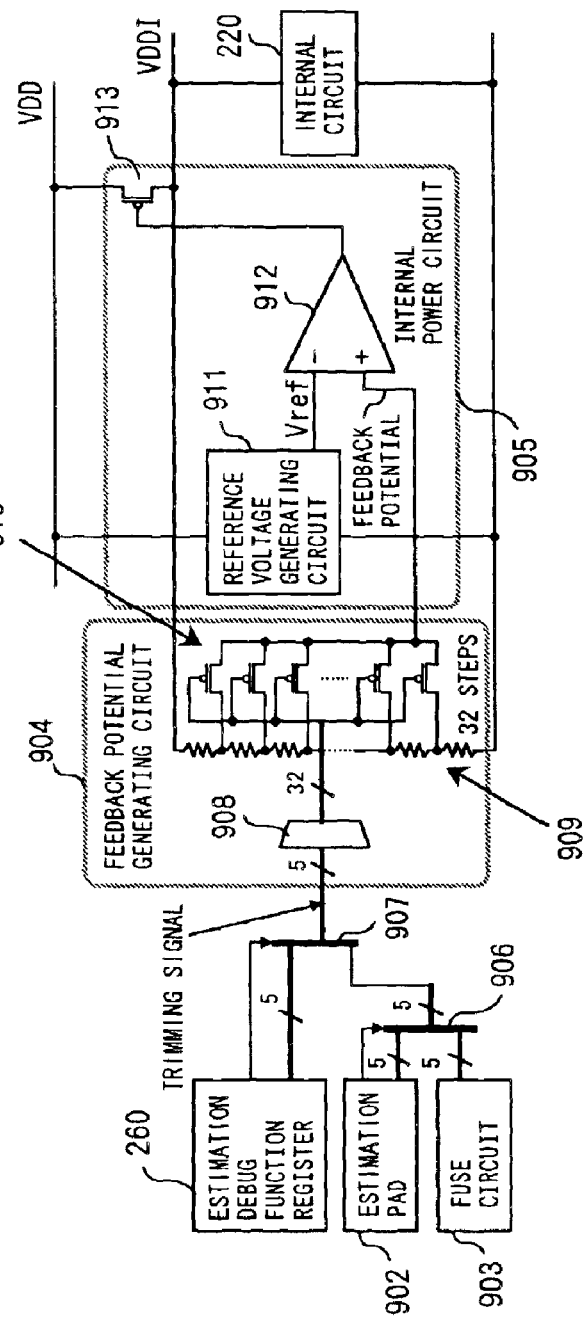
FIG. 9 is a circuit view of a constitutional example of an internal power VDD I trimming portion in the SRAM.

FIG. 9 shows the trimming portion of the internal power VDDI in the SRAM shown in FIG. 1.

An internal power generating circuit 905 compares an output voltage of a feedback potential generating circuit 904 with a reference voltage Vref from a reference voltage generating circuit 911 in a differential amplifier 912, and based on the comparison result, a p-channel MOS transistor 913 is driven, thereby obtaining the voltage VDDI at a predetermined level to which the voltage level of the high potential power VDD is lowered. The feedback potential generating circuit 904 includes a partial pressure resistor group 909 formed by connecting a plurality of resistors in serial, a switch MOS transistor (p-channel MOS transistor) group 910 for selecting a tap of this partial pressure resistor group, and a decoder 908 for controlling the operation of the switch MOS transistor group 910. A selecting circuit 906 for selecting a logic output of an estimation pad 902 or a logic output of a fuse circuit 903 is provided in the trimming portion and a selecting circuit 907 for selecting the output signal of the selecting circuit 906 or an output signal of the estimation debug function register 260 is provided there. The output signal of the selecting circuit 907 is transmitted to the decoder 908. The decoder 908 creates an operation control signal of the switch MOS transistor group 910 according to the output signal of the selecting circuit 907. According to the operation control of the switch MOS transistor group 910, the feedback potential can be changed into 32 steps, thereby changing the voltage level of the internal power voltage VDDI. The selecting circuit 906 can properly select the trimming of the internal power voltage VDDI by using the estimation pad 902 or by using the fuse circuit 903. Even after the trimming by the estimation pad 902 or the fuse circuit 903, the selecting circuit 907 can select the output signal of the estimation debug function register 260, thereby performing the trimming by the JTAG portion 208.

Figure 10:
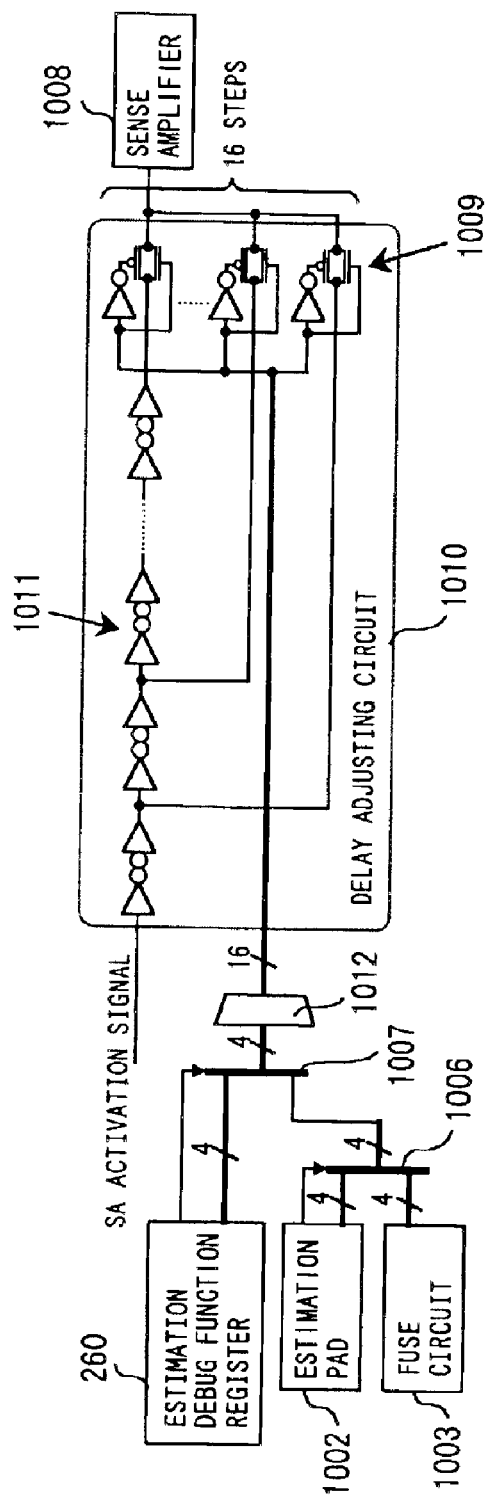
FIG. 10 is a circuit view of a constitutional example of a sense amplifier activation adjusting unit in the SRAM.

FIG. 10 shows the adjusting circuit of the activation timing of the sense amplifier (SA) in the SRAM shown in FIG. 1.

The sense amplifier 1008 is included in the input/output circuit 204. An SA activating signal for activating the sense amplifier 1008 is transmitted to the sense amplifier 1008 from the control circuit 205 through a delay adjusting circuit 1010. The delay adjusting circuit 1010 includes a plurality of delay steps 1011 formed by connecting a plurality of inverters and a tap selecting circuit 1009 for selecting an output tap in each delay step 1011. The tap selecting circuit 1009 includes a try state buffer and an inverter for driving the above. The operation of the tap selecting circuit 1009 is controlled by an output signal of the decoder 1012.

A selecting circuit 1006 for selecting a logic output of the estimation pad 1002 or a logic output of the fuse circuit 1003 is provided in the trimming portion and a selecting circuit 1007 for selecting the output signal of this selecting circuit 1006 or an output signal of the estimation debug function register 260 is provided there. The output signal of the selecting circuit 1007 is transmitted to the decoder 1012. The decoder 1012 creates an operation control signal of the tap selecting circuit 1009 according to the output signal of the selecting circuit 1007. According to the operation control of the tap selecting circuit 1009, a delay amount added to the SA activating signal can be changed into 16 steps, thereby making it possible to adjust the activation timing of the sense amplifier 1008. The selecting circuit 1006 can properly select whether the activation timing of the sense amplifier 1008 is adjusted by using the estimation pad 1002 or by using the fuse circuit 1003. Even after the trimming by the estimation pad 1002 or the fuse circuit 1003, the selecting circuit 1007 can select an output signal of the estimation debug function register 260, thereby performing the trimming by the JTAG portion 208.

Figure 11:
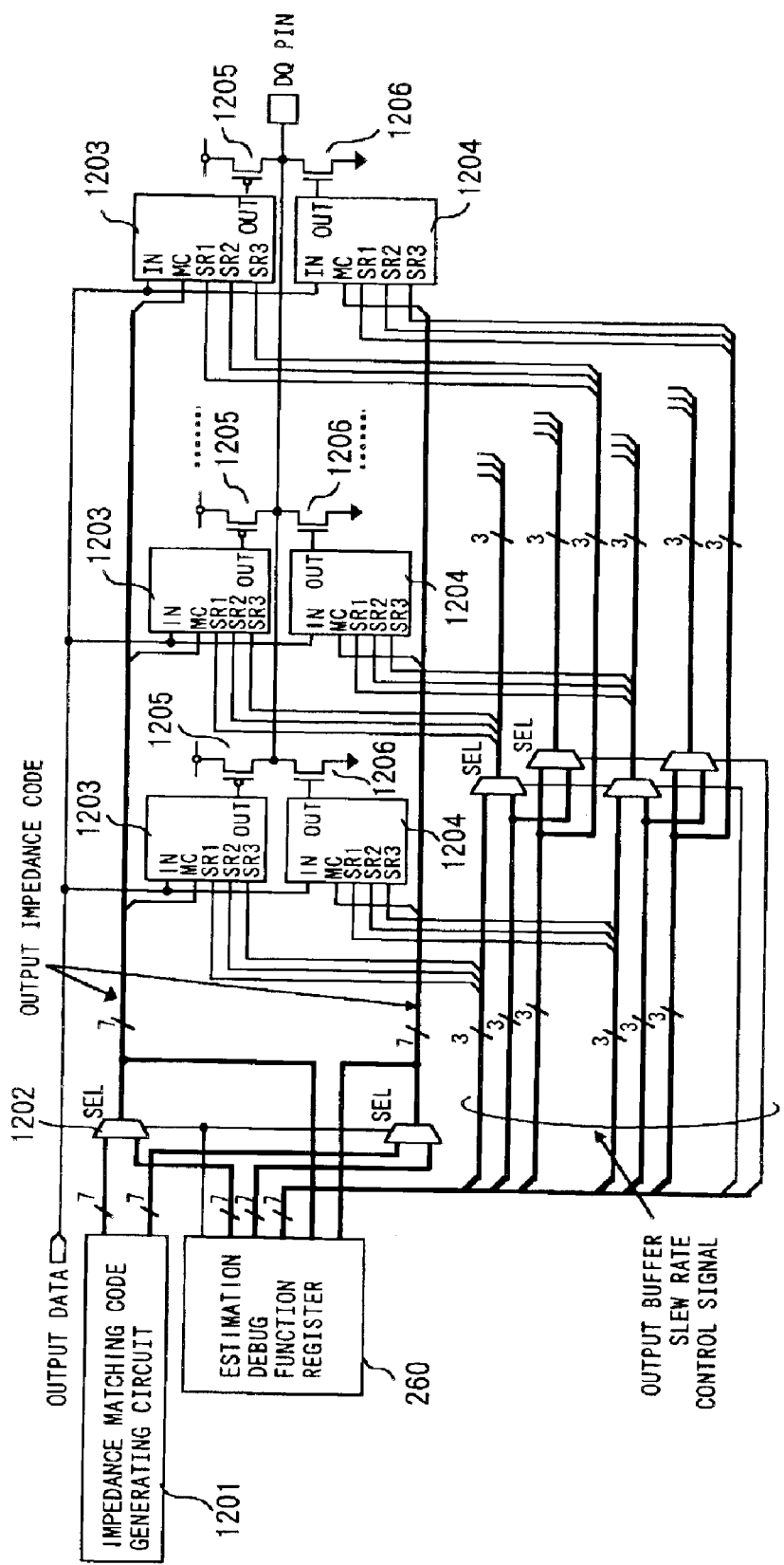
FIG. 11 is a circuit view of a constitutional example of an output impedance code R/W method and a slew rate control unit in the SRAM.

FIG. 11 shows the constitutional example of an output buffer in the data input/output circuit 204 and its vicinity.

The output buffer is provided with each buffer formed by connecting a p-channel MOS transistor 1205 and an n-channel MOS transistor 1206 in serial and each driver for driving the buffer in the prior stage. The drivers are provided with a plurality of output pre-buffers 1203 and a plurality of output pre-buffers 1204. The operation of each output pre-buffer 1203 and each output pre-buffer 1204 is controlled by an impedance matching code generating circuit 1201 and the estimation debug function register 260.

Figure 12:
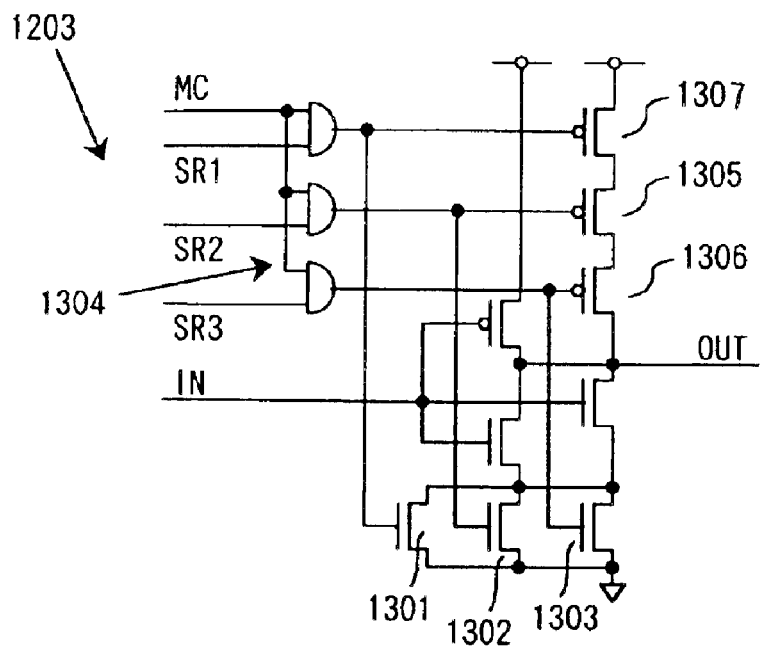
FIG. 12 is a circuit view of a constitutional example of an output pre-buffer in FIG. 11.

The output pre-buffer circuits 1203 have the same structure and the structure of one of them is shown, by way of example, in FIG. 12. Basically, it is formed by an inverter with the p-channel MOS transistor combined with the n-channel MOS transistor. The n-channel MOS transistors 1301 to 1303 and the p-channel MOS transistors 1304 to 1306 are on/off controlled according to the output of the logic circuit 1307, thereby controlling the driving power of the output pre-buffer 1203.

Figure 13:
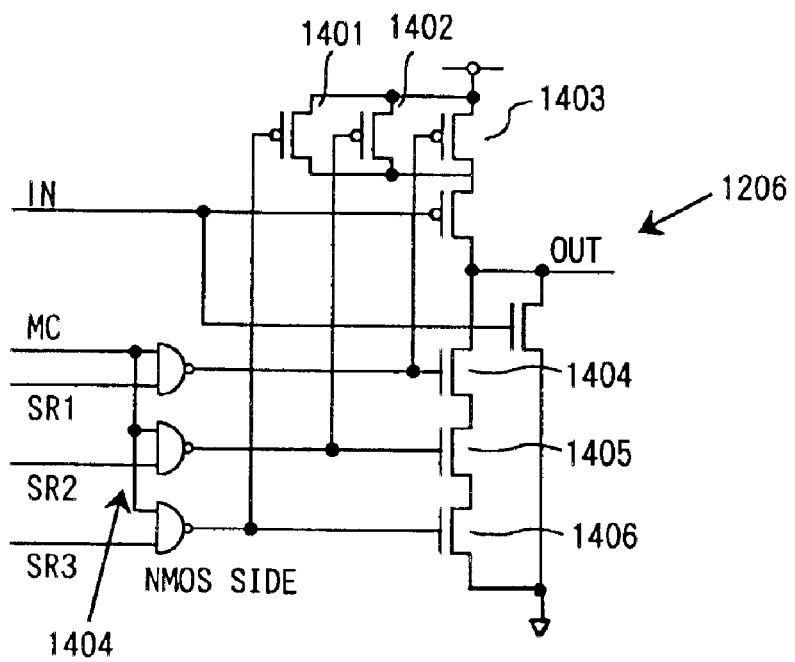
FIG. 13 is a circuit view of a constitutional example of the output pre-buffer in FIG. 11.

The output pre-buffers 1204 have the same structure and the structure of one of them is shown, by way of example, in FIG. 13. Basically, it is formed by an inverter with the p-channel MOS transistor combined with the n-channel MOS transistor. The n-channel MOS transistors 1404 to 1406 and the p-channel MOS transistors 1401 to 1403 are on/off controlled according to the output signal of the logic circuit 1407, thereby controlling the driving power of the output pre-buffer 1204.

The output buffer transmits the switching of the data input IN to the MOS transistors 1205 and 1206, and actually in order to transmit the signal to the MOS transistors 1205 and 1206, it is necessary that the impedance code MC should be at a high level. The impedance code is created by the impedance matching code generating circuit 1201 and the codes for fourteen bits become the logic "1" or "0" so that the output impedance should take a desired value, in the MOS transistors connected in multi-stages. Namely, when the impedance code takes all the logic "1", all the output pre-buffers are operated, and since all the MOS transistors are switched upon receipt of the output data, it becomes the minimum impedance. The estimation debug function register of the JTAG has a function of providing the information to the above-mentioned impedance code and a function of reading out the impedance codes distributed to the output pre-buffers, and this is an output impedance code R/W (Read/Write).

Output buffer slew rate control signals are distributed to the output pre-buffers as shown in FIG. 11, in the same way as the impedance code. By controlling the driving power of the output pre-buffer according to the slew rate control signal as shown in FIG. 13, a speed of switching the MOS transistor becomes variable and it is possible to control the rising and falling of the DQ output waveform (tr/tf), and the estimation debug function register provides the information of the output slew rate control.

Figure 2:
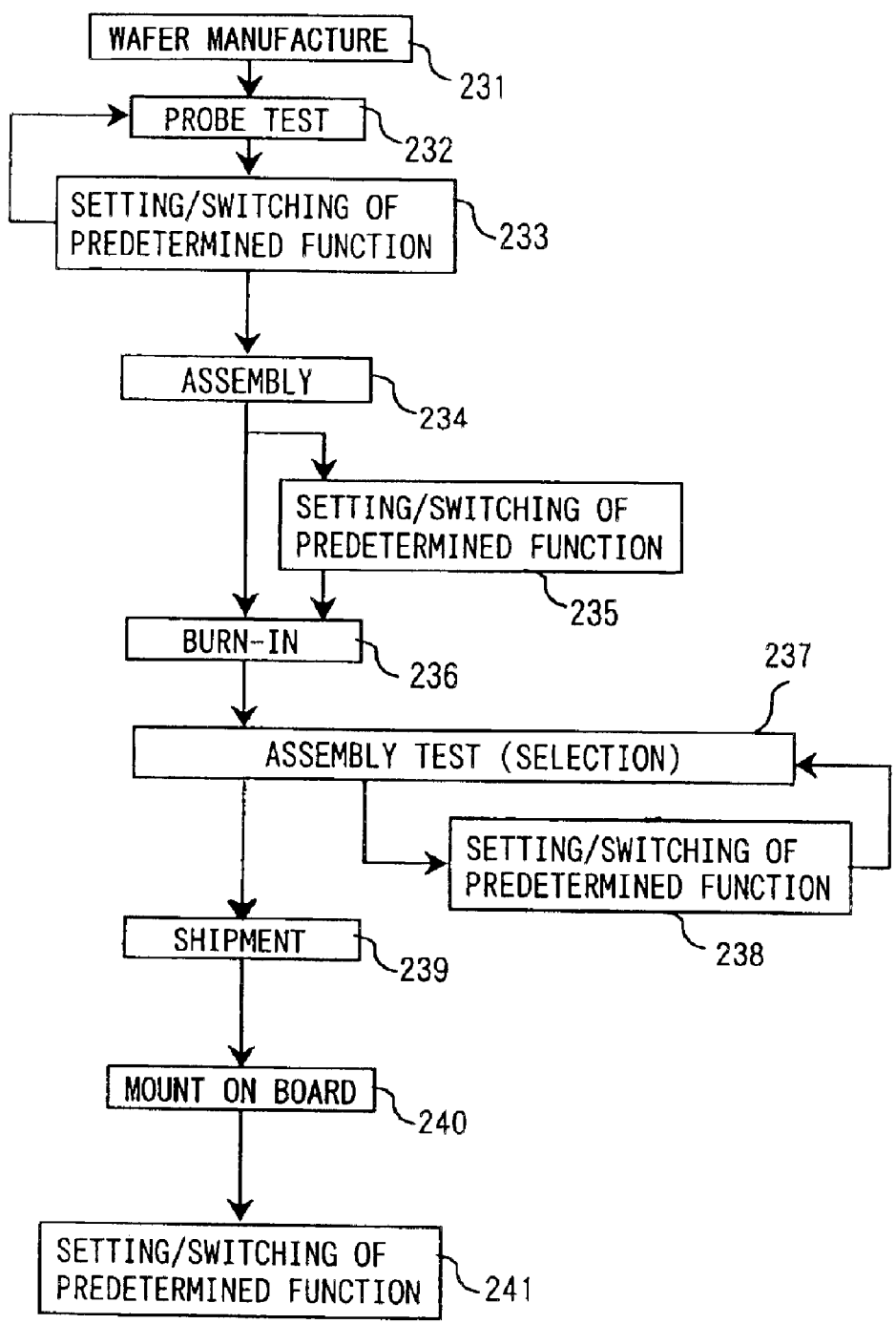
FIG. 2 is a flow chart showing a flow of manufacturing the SRAM.

FIG. 2 shows a flow chart of manufacturing the SRAM. Wafer manufacture is performed (231) and a probing test is performed (232). At this time, depending on necessity, trimming and estimation are performed (233). The fuse circuit, the estimation pad, and the JTAG portion 208 are used for this trimming and estimation. Thereafter, assembly is performed (234). After the assembly, switching of a predetermined function (235) and burn-in (236) are performed. In this case, the JTAG portion 208 is used for the switching of a predetermined function. Thereafter, the assembled product is tested (237), and shipped (239). When it proves to be defective in the above test, setting/switching of the predetermined function is performed (238) and it is tested again (237) to investigate the cause of the defective. The JTAG portion 208 is used for the switching of the predetermined function in Step 238. The wafer is mounted on a user system board and depending on a necessity, a predetermined function is switched (241). The JTAG portion 208 is used for the setting/switching of this predetermined function.

Thus, because of having the JTAG portion 208, even after the shipment, it is possible to set and switch a predetermined function.

As mentioned above, although the invention made by the present inventor has been described concretely, the invention is not restricted to this but it is needless to say that various modifications may be made without departing from its sprit or scope.

Figure 14:
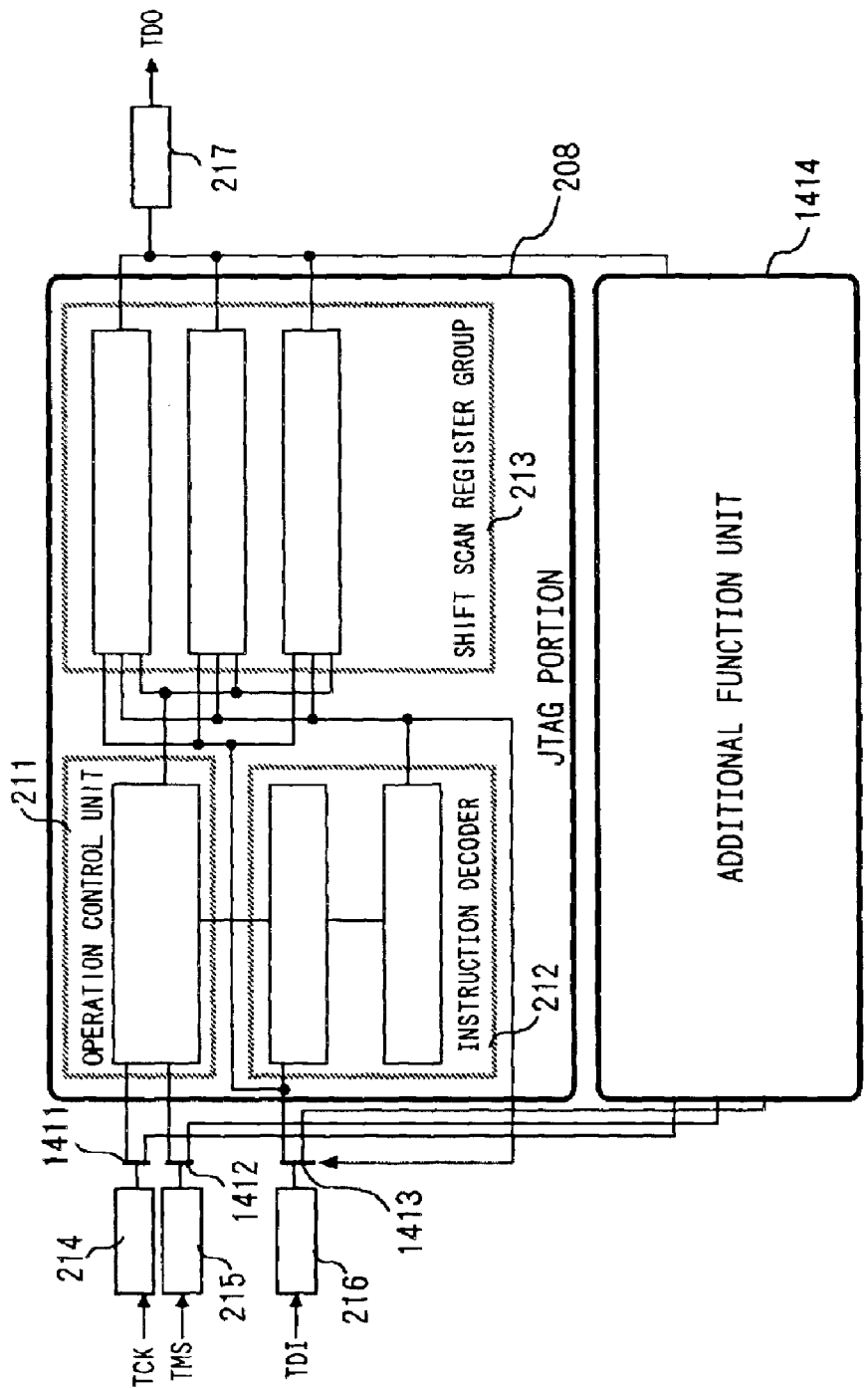
FIG. 14 is a block diagram of another constitutional example of a main portion in the SRAM.

For example, as illustrated in FIG. 14, it may be provided with an additional function unit 1414 having the same function as that of the JTAG portion 208, hence to use the JTAG portion 208 and the additional function unit 1414 selectively. The output terminal of the JTAG portion 208 and the output terminal of the additional function unit 1414 are connected to the output circuit 217 in common. Selecting circuits 1411, 1412, and 1413 for connecting the respective input circuits 214, 215, and 216 with the JTAG portion 208 or the additional function unit 1414 selectively are provided on the input side of the JTAG portion 208 and the additional function unit 1414. The operations of the selecting circuits 1411, 1412, and 1413 can be controlled by the TAP controller 261 in the JTAG portion 208.

In the above embodiment, although the description has been made in the case of realizing a lot of modes selectively by the JTAG portion 208, including the first mode capable of trimming the voltage level of the internal power that is the dynamic operation of the internal circuit, the second mode capable of trimming the voltage level of the internal power at a burn-in, and a third mode capable of trimming the pulse width of the word line select signal and the column select signal for selecting a memory cell included in the internal circuit, the object of the invention can be achieved by realizing at least one of them.

Although the invention has been described chiefly in the case of applying the invention made by the inventor to the SRAM that is its useful field, the invention is not restricted to this but it can be widely adopted to various kinds of semiconductor integrated circuit devices.

The invention can be used under a condition of including at least an internal circuit having a predetermined function.

What is claimed is:

1. A semiconductor integrated circuit device including an internal circuit and a control circuit for controlling the internal circuit, wherein the control circuit comprises a controller capable of realizing by using a terminal defined by JTAG, at least, one of the following modes:

a first mode capable of adjusting a pulse width of a word line selecting signal or a column selecting signal for selecting a memory cell included in the internal circuit;

a second mode capable of adjusting a timing for activating a sense amplifier included in the internal circuit;

a third mode capable of adjusting a pulse signal for selecting a word line or a column for selecting a memory cell included in the internal circuit, according to a clock signal;

a fourth mode capable of adjusting a timing for equalizing a data bus for reading out data in the internal circuit;

an fifth mode capable of adjusting the rising characteristic or falling characteristic of data supplied from an output circuit included in the internal circuit;

a sixth mode capable of switching a simultaneous output bit structure of the data in the internal circuit; and a seventh mode capable of turning a register for data output in the internal circuit into a slew state.

2. The semiconductor integrated circuit device according to claim 1, wherein the controller comprises an instruction decoder for decoding an input instruction, a shift scan register circuit for enabling a boundary scan operation based on the decoded result in the instruction decoder, and an operation controller for controlling the operations of the instruction decoder and the shift scan register circuit, and the shift scan register circuit includes a register capable of information settings for controlling a switching mode.

3. The semiconductor integrated circuit device, according to claim 2, comprising:

an estimation debug function shift register capable of scanning out information for estimation debug;

an estimation debug function update register capable of updating a mode about trimming or estimation by updating memory contents according to the information scanned in the estimation debug function shift register; and a controller for controlling the operations of the estimation debug function shift register and the estimation debug function update register.

4. The semiconductor integrated circuit device, according to claim 3, comprising:

a fuse circuit capable of logic setting;

an estimation pad;

a first selecting unit capable of selecting an output signal of the fuse circuit or a signal depending on a state of the estimation pad;

a second selecting unit capable of selecting the selected output logic of the first selecting unit or an output signal of the estimation debug function register; and a circuit for performing adjustment according to the selected output signal of the second selecting unit.

5. A semiconductor integrated circuit device including an internal circuit and a control circuit for controlling the internal circuit, wherein the control circuit comprises a controller capable of realizing a switching control of a mode for adjusting the internal circuit by using a terminal defined by JTAG;

the controller includes an instruction decoder for decoding an input instruction, a shift scan register circuit for enabling a boundary scan operation based on the decoded result in the instruction decoder and capable of information settings for switching a mode for adjusting the internal circuit, and an operation controller for controlling the operations of the instruction decoder and the shift scan register circuit, the shift scan register circuit includes an estimation debug function shift register capable of scanning out information for estimation debug; and an estimation debug function update register capable of setting the mode by setting memory contents according to the information scanned in the estimation debug function shift register, the operation controller includes a controller for controlling the operations of the estimation debug function shift register and the estimation debug function update register.

6. The semiconductor integrated circuit device, according to claim 5, comprising:

a fuse circuit capable of information setting;

an estimation pad;

a first selecting unit capable of selecting an output signal of the fuse circuit or a signal depending on a state of the estimation pad;

a second selecting unit capable of selecting the selected output logic of the first selecting unit or an output signal of the estimation debug function register; and a circuit for performing adjustment according to the selected output signal of the second selecting unit.

* * * * *